US011855636B2

(12) United States Patent
Wang et al.

(10) Patent No.: US 11,855,636 B2
(45) Date of Patent: Dec. 26, 2023

(54) OSCILLATOR AND CLOCK GENERATION CIRCUIT

(71) Applicant: CHANGXIN MEMORY TECHNOLOGIES, INC., Hefei (CN)

(72) Inventors: Yuxia Wang, Hefei (CN); Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/812,813

(22) Filed: Jul. 15, 2022

(65) Prior Publication Data

US 2022/0352876 A1 Nov. 3, 2022

Related U.S. Application Data

(63) Continuation of application No. PCT/CN2021/118858, filed on Sep. 16, 2021.

(30) Foreign Application Priority Data

Oct. 28, 2020 (CN) ........................ 202011173760.4

(51) Int. Cl.
*H03K 3/03* (2006.01)
*H03K 3/017* (2006.01)
(Continued)

(52) U.S. Cl.
CPC ........... *H03K 3/0315* (2013.01); *H03K 3/011* (2013.01); *H03K 3/017* (2013.01); *H03K 3/3545* (2013.01); *H03L 1/02* (2013.01); *H03L 5/00* (2013.01)

(58) Field of Classification Search
CPC .. H03L 1/02; H03L 5/00; H03K 3/011; H03K 3/0315; H03K 3/3545
(Continued)

(56) References Cited

U.S. PATENT DOCUMENTS 7,015,739 B2 3/2006 Lee et al.
7,501,870 B2 3/2009 Choi et al.
(Continued)

FOREIGN PATENT DOCUMENTS

CN 1542861 A 11/2004
CN 1675836 A 9/2005
(Continued)

OTHER PUBLICATIONS

European Search Report cited in EP21856922.6 dated Nov. 2, 2022, 11 pages.
(Continued)

*Primary Examiner* — Arnold M Kinkead
(74) *Attorney, Agent, or Firm* — Cooper Legal Group, LLC

(57) ABSTRACT

Embodiments of the present application provide an oscillator and a clock generation circuit. The oscillator includes: a first ring topology, including a plurality of first inverters connected end to end, and configured to transmit an oscillation signal at a first transmission speed; and a second ring topology, including a plurality of second inverters connected end to end, and configured to transmit the oscillation signal at a second transmission speed, wherein the present application, the first ring topology is electrically connected to the second ring topology, and the second transmission speed is less than the first transmission speed.

19 Claims, 5 Drawing Sheets

(51) Int. Cl.
*H03K 3/011* (2006.01)
*H03K 3/354* (2006.01)
*H03L 5/00* (2006.01)
*H03L 1/02* (2006.01)

(58) Field of Classification Search
USPC ........................................ 331/57, 183, 176, 2
See application file for complete search history.

(56) References Cited

U.S. PATENT DOCUMENTS

| | | | |
|---|---|---|---|
| 9,252,753 B2 | 2/2016 | Lin | |
| 9,270,256 B2 | 2/2016 | Lee | |
| 9,667,252 B1 | 5/2017 | Lee et al. | |
| 9,998,125 B2 | 6/2018 | Balamurugan et al. | |
| 10,249,354 B1 | 4/2019 | Lee et al. | |
| 10,270,429 B1 | 4/2019 | Wang et al. | |
| 10,418,983 B1 * | 9/2019 | Lee | H03K 3/017 |
| 10,630,273 B2 | 4/2020 | Tung et al. | |
| 10,700,672 B2 | 6/2020 | Savary et al. | |
| 10,784,846 B1 | 9/2020 | Bucossi et al. | |
| 11,012,060 B2 | 5/2021 | Satoh | |
| 2004/0032300 A1 | 2/2004 | Joordens et al. | |
| 2007/0018737 A1 | 1/2007 | Drake et al. | |
| 2007/0090867 A1 | 4/2007 | Kim | |
| 2009/0051443 A1 | 2/2009 | Illegems et al. | |
| 2009/0302912 A1 | 12/2009 | Lee | |
| 2012/0075025 A1 | 3/2012 | Ueno | |
| 2015/0372665 A1 | 12/2015 | Tohidian et al. | |
| 2017/0117887 A1 | 4/2017 | Lee et al. | |
| 2017/0194947 A1 | 7/2017 | Wei | |
| 2018/0364752 A1 * | 12/2018 | Li | H03K 5/1565 |
| 2019/0237127 A1 | 8/2019 | Moon et al. | |
| 2019/0257696 A1 | 8/2019 | Rachala et al. | |
| 2019/0334508 A1 | 10/2019 | Tang | |
| 2019/0348971 A1 | 11/2019 | Kim et al. | |
| 2020/0160902 A1 | 5/2020 | Gans | |
| 2020/0162066 A1 | 5/2020 | Gans | |

FOREIGN PATENT DOCUMENTS

| | | | |
|---|---|---|---|
| CN | 1956329 | A | 5/2007 |
| CN | 101141129 | A | 3/2008 |
| CN | 101409541 | A | 4/2009 |
| CN | 101629978 | A | 1/2010 |
| CN | 103684365 | A | 3/2014 |
| CN | 104270122 | A | 1/2015 |
| CN | 104716929 | A | 6/2015 |
| CN | 104734697 | A | 6/2015 |
| CN | 105099445 | A | 11/2015 |
| CN | 105281757 | A | 1/2016 |
| CN | 205385473 | U | 7/2016 |
| CN | 106374890 | A | 2/2017 |
| CN | 106888007 | A | 6/2017 |
| CN | 106941344 | A | 7/2017 |
| CN | 105281757 | B | 7/2018 |
| CN | 108768385 | A | 11/2018 |
| CN | 110266294 | A | 9/2019 |
| CN | 110830011 | A | 2/2020 |
| CN | 111103530 | A | 5/2020 |
| CN | 111147055 | A | 5/2020 |
| JP | 2006333184 | A | 12/2006 |
| KR | 20080009855 | A | 1/2008 |
| KR | 100998677 | B1 | 12/2010 |

OTHER PUBLICATIONS

Yyons2019, https://max.book118.com/html/2019/0901/6153212200002101.shtm, Sep. 2, 2019, 9 pages.

International Search Report cited in PCT/CN2021/118858 dated Dec. 2, 2021, 10 pages.

International Search Report cited in PCT/CN2021/107942 dated Oct. 20, 2021, 9 pages.

Kusaga, et al., "Four-Stage Ring Oscillator for Quadrature Signal Generation", ICSES 2008 International Conference On Signals and Electronic Systems Kraków, Sep. 14-17, 2008, 4 pages.

Alon, Elad, "Schematic and Layout Simulation Exercise", University of California, Berkeley, EE141 Fall Sep. 23, 2009, 5 pages.

Kim< et al., "A 20GB/s 256Mb DRAM with an Inductorless Quadrature PLL and a Cascaded Pre-emphasis Transmitter", IEEE International Solid-State Circuits Conference, Feb. 9, 2005, 2 pages.

Zhou, Mingsheng, "Integrated Circuit Design and Implementation Technology Based on ZENI", Oct. 31, 2013, Xidian University Press, 1 page.

Zhang, et al., "Design of Low Noise Single Ended CMOS Ring Voltage Controlled Oscillators", Jul. 21, 2004, 4 pages.

International Search Report cited in PCT/CN2021/106019 dated Oct. 20, 2021, 9 pages.

International Search Report cited in PCT/CN2021/105250 dated Oct. 13, 2021, 9 pages.

International Search Report cited in PCT/CN2021/105207 dated Sep. 28, 2021, 10 pages.

International Search Report cited in PCT/CN2021/112329 dated Oct. 29, 2021, 8 pages.

Non-Final Office Action cited in U.S. Appl. No. 17/449,525, dated Jan. 21, 2022, 14 pages.

* cited by examiner

OSCILLATOR AND CLOCK GENERATION CIRCUIT

CROSS-REFERENCE TO RELATED APPLICATIONS

This is a continuation of International Application No. PCT/CN2021/118858, filed on Sep. 16, 2021, which claims the priority to Chinese Patent Application No. 202011173760.4, titled "OSCILLATOR AND CLOCK GENERATION CIRCUIT" and filed on Oct. 28, 2020. The entire contents of International Application No. PCT/CN2021/118858 and Chinese Patent Application No. 202011173760.4 are incorporated herein by reference.

TECHNICAL FIELD

Embodiments of the present application relate to, but are not limited to, an oscillator and a clock generation circuit.

BACKGROUND

As a commonly used semiconductor memory in computers, a dynamic random access memory (DRAM) is composed of many repeated memory cells. In a DRAM I/O circuit, a high-speed clock signal of a specific frequency is required for reading, writing, and clock calibration.

A ring oscillator may be used to generate a high-speed clock signal inside the DRAM, to meet the foregoing requirement. However, a frequency of an oscillation signal generated by a current ring oscillator is low, which is difficult to meet the high speed requirement. In addition, the frequency and a duty cycle of the oscillation signal generated by the current ring oscillator are easily affected by a process, a supply voltage, a temperature, a clock load, and the like, causing deviations in the clock frequency and the duty cycle.

SUMMARY

Embodiments of the present application provide an oscillator, including: a first ring topology, including a plurality of first inverters connected end to end, and configured to transmit an oscillation signal at a first transmission speed; and a second ring topology, including a plurality of second inverters connected end to end, and configured to transmit the oscillation signal at a second transmission speed, where the first ring topology is electrically connected to the second ring topology, and the second transmission speed is less than the first transmission speed.

The embodiments of the present application further provide a clock generation circuit, including: the oscillator described above; and a frequency adjustment module, connected to the oscillator, and configured to adjust a frequency of the oscillator.

BRIEF DESCRIPTION OF THE DRAWINGS

One or more embodiments are exemplified by corresponding drawings, and these exemplified descriptions do not constitute a limitation on the embodiments. Components with the same reference numerals in the drawings are denoted as similar components, is and the drawings are not limited by scale unless otherwise specified.

DETAILED DESCRIPTION

In order to make the objectives, technical solutions and advantages of the embodiments of the present disclosure clearer, the embodiments of the present disclosure are described below with reference to the accompanying drawings. Those of ordinary skill in the art should understand that many technical details are proposed in each embodiment of the present disclosure to help the reader better understand the present disclosure. However, even without these technical details and various changes and modifications made based on the following embodiments, the technical solutions claimed in the present disclosure may still be realized.

Figure 1:
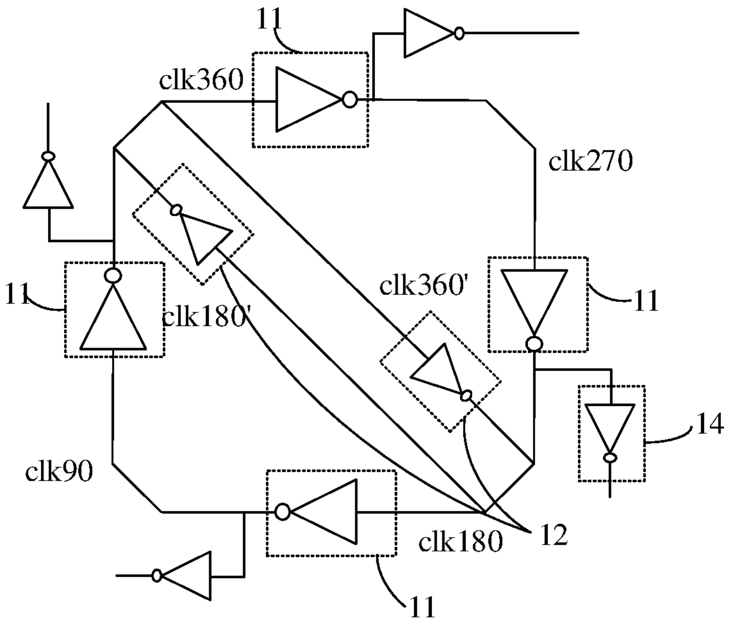
FIG. 1 is a schematic diagram of a circuit structure of an oscillator according to an embodiment of the present application.

FIG. 1 is a schematic diagram of a circuit structure of an oscillator according to an embodiment of the present application.

Referring to FIG. 1, the oscillator includes: a first ring topology, including a plurality of first inverters 11 connected end to end, and configured to transmit an oscillation signal at a first transmission speed; and a second ring topology, including a plurality of second inverters 12 connected end to end, and configured to transmit the oscillation signal at a second transmission speed. The first ring topology is electrically connected to the second ring topology, and the second transmission speed is less than the first transmission speed.

The transmission speed refers to a time for the oscillation signal to change from a high level to a low level or from a low level to a high level. A lower transmission speed indicates a longer transmission time, and a lower flip speed of the oscillation signal indicates a longer period and a lower frequency of the oscillation signal. A higher transmission speed indicates a shorter transmission time, and a higher flip speed of the oscillation signal indicates a shorter period and a higher frequency of the oscillation signal. That the second transmission speed is less than the first transmission speed means that the transmission time of the oscillation signal through the second inverter 12 is shorter than the transmission time of the oscillation signal through the first inverter 11.

In some embodiments, a quantity of the first inverters 11 is N, and N is an integer greater than or equal to 4. Correspondingly, a quantity of the second inverters 12 is M, and M is an integer greater than or equal to 2.

An input terminal of each first inverter 11 is denoted as a first node, and the first ring topology has N first nodes. For example, the first nodes are clk360, clk270, clk180, and clk90 in FIG. 1. An input terminal of each second inverter 12 is denoted as a second node, and the second ring topology has M second nodes. For example, the second nodes are clk360' and clk180' in FIG. 1. At least two second nodes are electrically connected to a corresponding quantity of first nodes. For example, in FIG. 1, clk360' is connected to clk360 and clk180' is connected to clk180.

On an oscillation path of the first ring topology, each first node has a different phase. For example, there are four first inverters 11, four first nodes on the oscillation path respectively have a first phase clk90, a second phase clk180, a third phase clk270, and a fourth phase clk360, and the four first nodes constitute an oscillation cycle of 360 degrees, that is, each first node corresponds to a phase shift of 90 degrees. Correspondingly, the second ring topology has two second nodes: one is the second node is clk180', electrically connected to the first node having the second phase clk180, and the other is the second node clk360', electrically connected to the first node having the fourth phase clk360.

In some embodiments, the second transmission speed is less than the first transmission speed, and the second transmission speed is greater than or equal to 0.5 times the first transmission speed. The transmission speed may be understood as being inversely proportional to a transmission delay of the inverter. For example, it is assumed that the transmission speed of the oscillation signal through the first inverter 11 is 100. In this case, the transmission speed of the oscillation signal through the second inverter 12 is greater than or equal to 50 and less than 100. For another example, it is assumed that a transmission delay of the oscillation signal through the first inverter 11 is 100 picoseconds (ps). In this case, the transmission delay of the oscillation signal through the second inverter 12 is greater than 100 ps and less than or equal to 200 ps. Such a setting can improve stability of the oscillator and quality of the oscillation signal.

Figure 2:
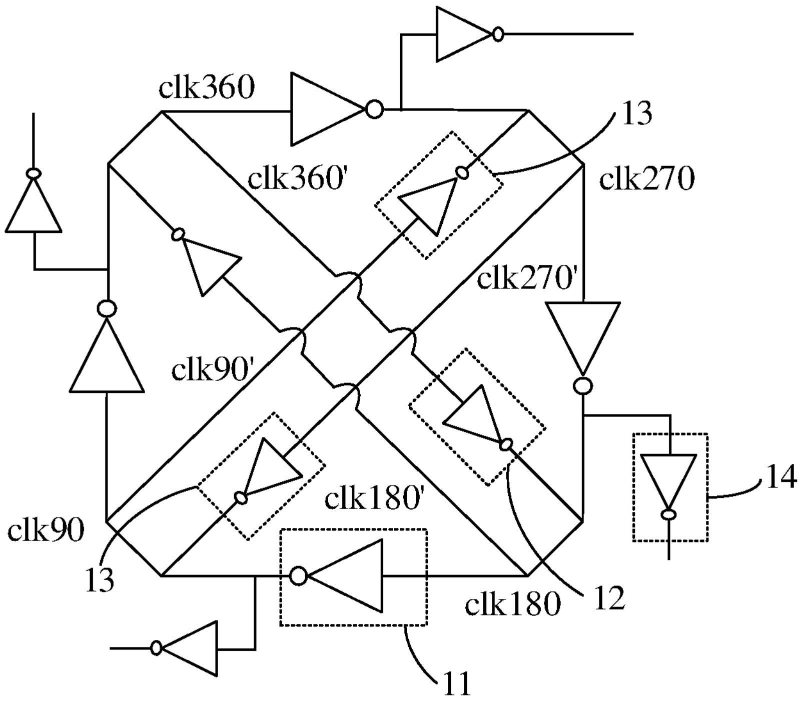
FIG. 2 is a schematic diagram of another circuit structure of an oscillator according to an embodiment of the present application.

In some embodiments, referring to FIG. 2, the oscillator may further include: a third ring topology, including a plurality of third inverters 13 connected end to end, and configured to transmit the oscillation signal at a third transmission speed. The first ring topology is electrically connected to the third ring topology, and the third transmission speed is less than the first transmission speed.

The first ring topology is used as an outer ring topology. The second ring topology and the third ring topology are used as inner ring topologies. Inverter quantities of different ring topology structures may be specifically as follows: a quantity of the first inverters 11 is U, and U is an integer greater than or equal to 4; a quantity of the second inverters 12 is V, and V is an integer greater than or equal to 2; and a quantity of the third inverters 13 is W, and W is an integer greater than or equal to 2.

An input terminal of each first inverter 11 is denoted as a first node, and the first ring topology has U first nodes. For example, the first nodes are clk360, clk270, clk180, and clk90 in FIG. 2. An input terminal of each second inverter 12 is denoted as a second node, and the second ring topology has V second nodes. For example, the second nodes are clk360' and clk180' in FIG. 2. An input terminal of each third inverter 13 is denoted as a is third node, and the third ring topology has W third nodes. For example, the second nodes are clk270' and clk90' in FIG. 2. At least two second nodes are electrically connected to a corresponding quantity of first nodes. At least two third nodes are electrically connected to a corresponding quantity of first nodes. For example, in FIG. 2, clk360' is connected to clk360, clk270' is connected to clk270, clk180' is connected to clk180, and clk90' is connected to clk90. In this way, oscillation signals of different first nodes have larger quantities of flips per unit time, thus improving the frequency of the transmitted oscillation signal, thereby improving the transmission speed of the oscillation signal.

In some embodiments, the second transmission speed is less than the first transmission speed, the second transmission speed is greater than or equal to 0.5 times the first transmission speed, and the third transmission speed is equal to the second transmission speed. The transmission speed may be understood as being inversely proportional to a transmission delay of the inverter. For example, it is assumed that the transmission speed of the oscillation signal through the first inverter 11 is 100. In this case, the transmission speed of the oscillation signal through the second inverter 12 is greater than or equal to 50 and less than 100. For another example, it is assumed that a transmission delay of the oscillation signal through the first inverter 11 is 100 picoseconds (ps). In this case, the transmission delay of the oscillation signal through the second inverter 12 is greater than 100 ps and less than or equal to 200 ps. Such a setting can improve stability of the oscillator and quality of the oscillation signal.

In some embodiments, the oscillator further includes a buffer inverter 14, an input terminal of the buffer inverter 14 receives the oscillation signal, and an output terminal of the buffer inverter 14 outputs a clock signal. The buffer inverter 14 is configured to isolate an impact of a back-end circuit (such as a duty cycle calibration circuit) of the oscillator as a load on the frequency of the oscillation signal, such that the oscillator maintains a high multiplexing rate.

In some embodiments, a transmission speed of the buffer inverter 14 is adjustable. For example, the transmission speed of the buffer inverter 14 is adjustable by adjusting a pull-up capability and/or a pull-down capability of the buffer inverter 14.

The pull-down capability of the buffer inverter 14 is decreased when the pull-up capability of the buffer inverter 14 is increased. The pull-down capability of the buffer inverter 14 is increased when the pull-up capability of the buffer inverter 14 is decreased.

The pull-up capability refers to a capability of charging a low-level signal to a high-level signal. The pull-down capability refers to a capability of discharging a high-level signal to a low-level signal. A duty cycle of the clock signal output by the buffer inverter 14 is increased when the pull-up capability is increased and the pull-down capability is decreased. The duty cycle of the clock signal output by the buffer inverter 14 is decreased when the pull-up capability is decreased and the pull-down capability is increased. In other words, the duty cycle of the clock signal is adjustable by controlling the pull-up capability and the pull-down capability of the buffer inverter 14 to change toward different trends, such that the duty cycle of the clock signal meets a preset requirement. It should be noted that, each first node can be connected to a buffer inverter 14, or a buffer inverter 14 can be connected in series between each first node and the back-end circuit to avoid an impact of the back-end circuit on the frequency of the oscillation signal, to ensure that each stage of the first inverter 11 of the oscillator has a high degree of load matching, such that the frequency of the oscillation signal of the oscillator is more stable. For example, in FIG. 2, clk360, clk270, clk180, and clk90 are each connected to a buffer inverter 14.

Figure 3:
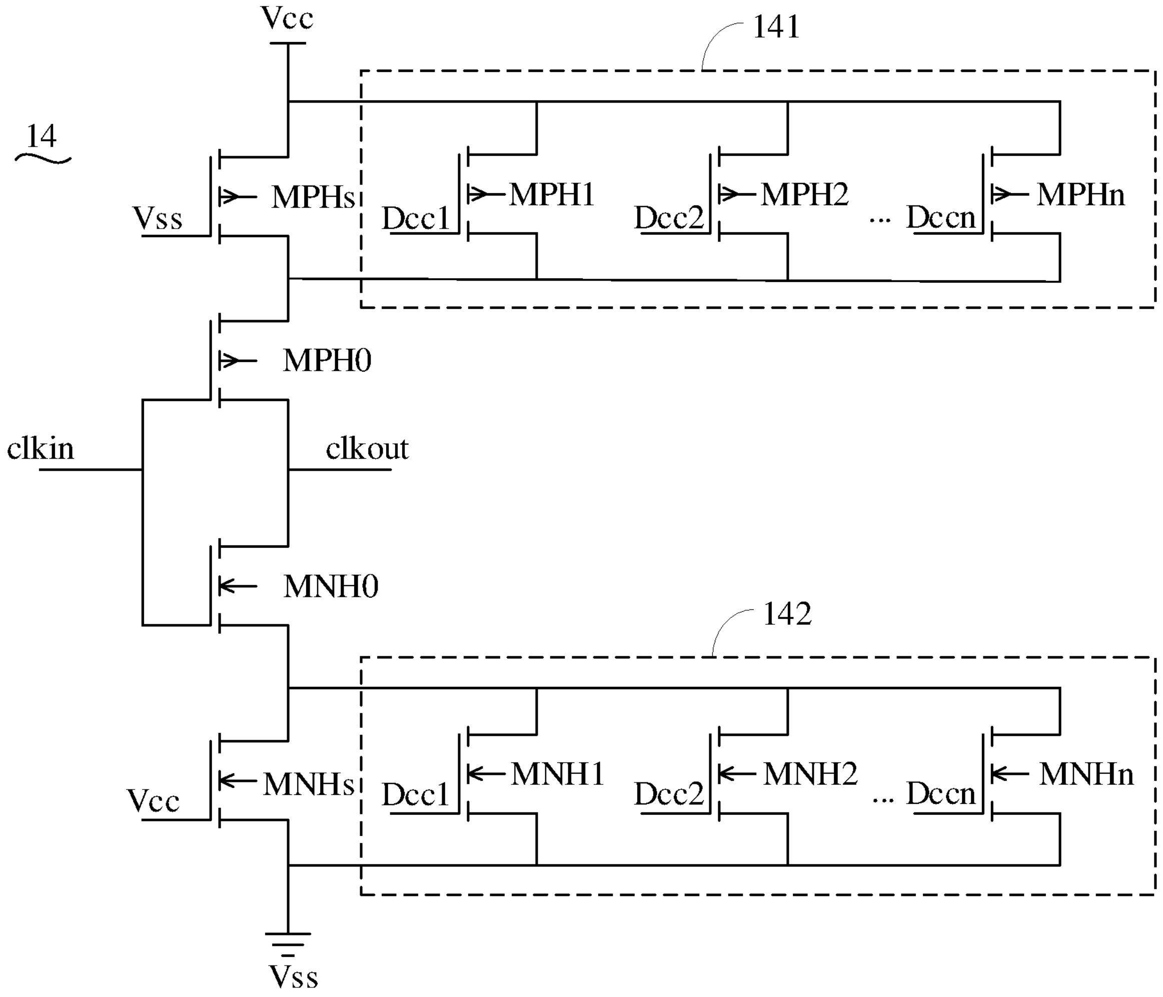
FIG. 3 is a schematic structural diagram of a buffer inverter in the oscillator shown in FIG. 2.

For example, referring to FIG. 3, the buffer inverter 14 includes: a first PMOS group 141, including H PMOSs (MPH1, MPH2, . . . , and MPHn), where a source of each of the H PMOSs is connected to a power terminal Vcc; a first NMOS group 142, including H NMOSs (MNH1, MNH2, . . . , and MNHn), where a source of each of the H NMOSs is connected to a ground terminal Vss; a zeroth PMOS MPH0, having a source connected to a drain of each of the H PMOSs; and a zeroth NMOS MNH0, having a source connected to a drain of each of the H NMOSs. A drain of the zeroth PMOS MPH0 is connected to a drain of the zeroth NMOS MNH0, as the output terminal clkout of the buffer inverter 14. A gate of the zeroth PMOS MPH0 is connected to a gate of the zeroth NMOS MNH0, as the input terminal clkin of the buffer inverter 14. A gate of each of the H PMOSs and a gate of each of the H NMOSs are both controlled by a duty cycle adjustment code group (Dcc1, Dcc2, . . . , and Dccn).

The duty cycle adjustment code group may be sent by a duty cycle adjustment module (not shown in the figure), and a PMOS and a PMOS transistor are each a PMOS transistor.

In some embodiments, a quantity of turned-on PMOS transistors in the first PMOS group 141 and/or a quantity of turned-on NMOS transistors in the first NMOS group 142 can be controlled by controlling parameters of the duty cycle adjustment code group, thereby adjusting the pull-up capability and/or the pull-down capability of the buffer inverter 14.

It should be noted that, the PMOS transistor and the NMOS transistor have different turn-on voltages. For example, when the first adjustment code Dcc1 in the duty cycle adjustment code group is at a high level, the first NMOS transistor MNH1 is turned on and the first PMOS transistor MPH1 is turned off; and when the first adjustment code Dcc1 is at a low level, the first NMOS transistor MNH1 is turned off and the first PMOS transistor MPH1 is turned on.

A duty cycle adjustment code simultaneously controls the first PMOS group 141 and the first NMOS group 142. Therefore, a larger quantity of turned-on PMOS transistor in the first PMOS group 141 indicates a smaller quantity of turned-on NMOS transistors in the first NMOS group 142. A larger quantity of turned-on PMOS transistors in the first PMOS group 141 indicates a smaller load value of the first PMOS group 141, a higher charging rate of the buffer inverter 14, and a stronger pull-up capability of the buffer inverter 14. Correspondingly, a smaller quantity of turned-on NMOS transistors in the first NMOS group 142 indicates a larger load value of the first NMOS group 142, a lower discharging rate of the buffer inverter 14, and a weaker pull-down capability of the buffer inverter 14. In this way, when a large quantity of PMOS transistors are turned on and a small quantity of NMOS transistors are turned on, the duty cycle of the clock signal output by the buffer inverter 14 is increased.

Correspondingly, when a small quantity of PMOS transistors are turned on and a large quantity of NMOS transistors are turned on, the pull-up capability of the buffer inverter 14 is decreased and the pull-down capability is increased, and the duty cycle of the clock signal output by the buffer inverter 14 is decreased.

In order to ensure normal operation of the zeroth PMOS MPH0 and the zeroth NMOS MNH0, an initial PMOS transistor MPHs and an initial NMOS transistor MNHs are further provided. The initial PMOS transistor MPHs has a source connected to the power terminal Vcc, a drain connected to the source of the zeroth PMOS MPH0, and a gate connected to the ground terminal Vss, that is, the initial PMOS transistor MPHs is turned on. The initial NMOS transistor MNHs has a source connected to the ground terminal Vss, a drain connected to the source of the zeroth NMOS MNH0, and a gate connected to the power terminal Vcc, that is, the initial NMOS transistor MNHs is turned on.

In some embodiments, the first transmission speed of the first inverter 11 is adjustable. The first transmission speed of the first inverter 11 is adjustable by adjusting a pull-up capability and/or a pull-down capability of the first inverter 11.

The pull-down capability of the first inverter 11 is increased when the pull-up capability of the first inverter 11 is increased. The pull-down capability of the first inverter 11 is decreased when the pull-up capability of the first inverter 11 is decreased. In this way, the frequency of the oscillation signal output by the oscillator can be adjusted, to obtain an oscillation signal meeting a preset frequency requirement.

Figure 4:
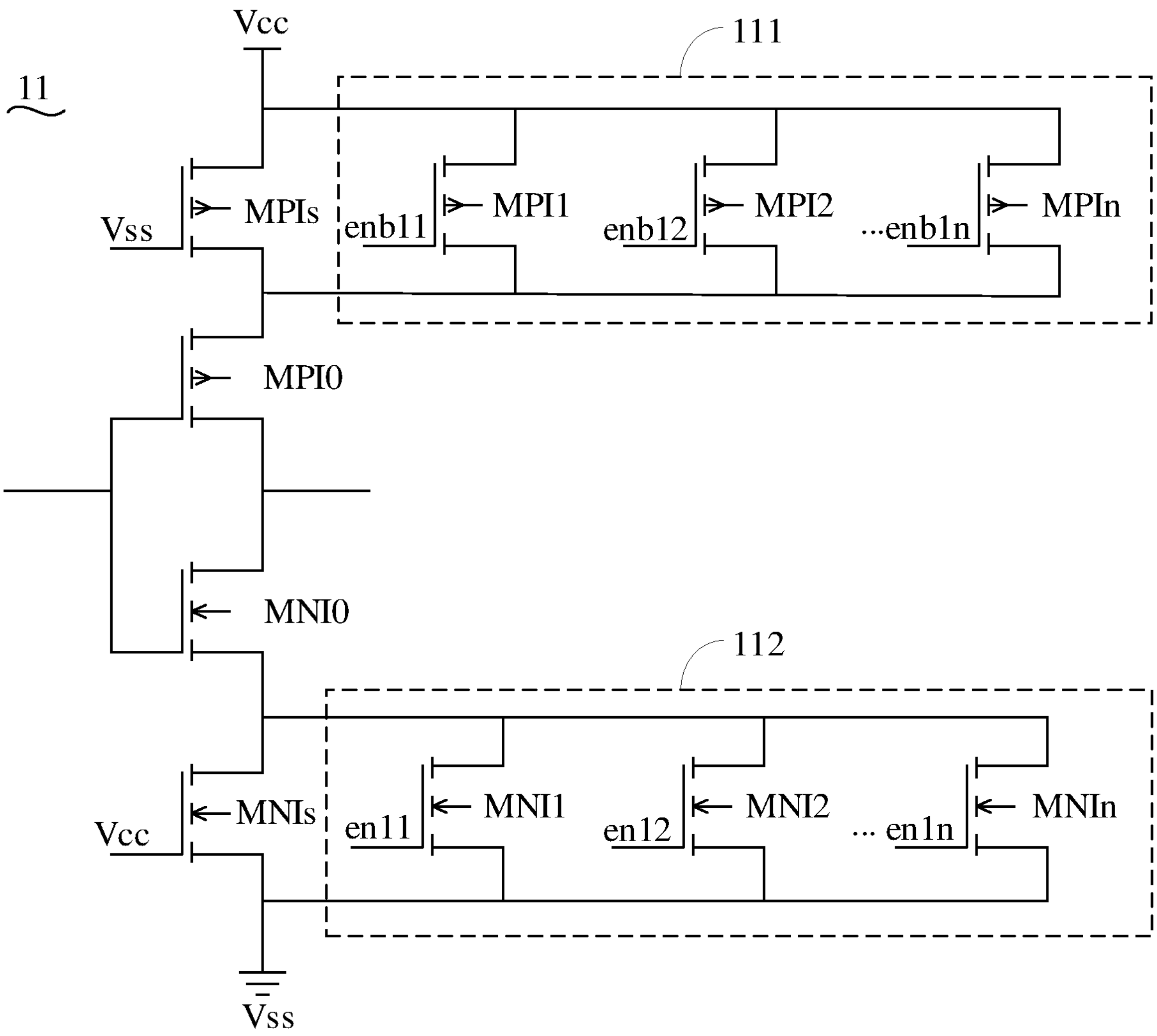
FIG. 4 is a schematic structural diagram of a first inverter in the oscillator shown in FIG. 2.

For example, referring to FIG. 4, the first inverter 11 includes: a third PMOS group 111, including I PMOSs (MPI1, MPI2, . . . , and MPIn), where a source of each of the I PMOSs is connected to a power terminal Vcc; a third NMOS group 112, including I NMOSs (MNI1, MNI2, . . . , and MNIn), where a source of each of the I NMOSs is connected to a ground terminal Vss; a second PMOS MPI0, having a source connected to a drain of each of the I PMOSs; and a second NMOS MNI0, having a source connected to a drain of each of the I NMOSs. A drain of the second PMOS MPI0 is connected to a drain of the second NMOS MNI0, as an output terminal of the first inverter 11. A gate of the second PMOS MPI0 is connected to a gate of the second NMOS MNI0, as an input terminal of the first inverter 11. A gate of each of the I PMOS transistors is controlled by a first reverse adjustment code group (enb11, enb12, . . . , and enb1*n*). A gate of each of the I NMOSs is controlled by a first positive adjustment code group (en11, en12, . . . , and en1*n*). The first transmission speed is adjustable changing the first reverse adjustment code group and/or the first positive adjustment code group.

In some embodiments, a quantity of turned-on PMOS transistors in the third PMOS group 111 can be controlled by controlling parameters of the first reverse adjustment code group, thereby adjusting the pull-up capability of the first inverter 11; and/or a quantity of turned-on NMOS transistors in the third NMOS group 112 can be controlled by controlling parameters of the first positive adjustment code group, thereby adjusting the pull-down capability of the first inverter 11.

It should be noted that, the first reverse adjustment code group and the first positive adjustment code group have opposite potentials, that is, opposite phases. When the first positive adjustment code en11 is at a high level, the first reverse adjustment code enb11 is at a low level. In this case, the first PMOS transistor MPI1 in the third PMOS group 111 is turned on, and the first NMOS transistor MNI1 in the third NMOS group 112 is turned on. Correspondingly, when the first positive adjustment code en11 is at a low level, the first reverse adjustment code enb11 is at a high level. In this case, the first PMOS transistor MPI1 in the third PMOS group 111 is turned off, and the first NMOS transistor MNI1 in the third NMOS group 112 is turned off.

In other words, a larger quantity of turned-on PMOS transistors in the third PMOS group 111 indicates a larger quantity of turned-on NMOS transistors in the third NMOS group 112, a stronger pull-up capability and a stronger pull-down capability of the first inverter 11, and a higher frequency of the oscillation signal output by the first inverter 11. Correspondingly, a smaller quantity of turned-on PMOS transistors in the third PMOS group 111 indicates a smaller quantity of turned-on NMOS transistors in the third NMOS group 112, a weaker pull-up capability and a weaker pull-down capability of the first inverter 11, and a lower frequency of the oscillation signal output by the first inverter 11.

In addition, the first inverter 11 has an initial PMOS transistor MPIs for ensuring that the second PMOS MPI0 is in a working state, and an initial NMOS transistor MNIs for ensuring that the second NMOS MNI0 is in a working state.

In some embodiments, a second transmission speed of the second inverter 12 is adjustable. The second transmission speed of the second inverter 12 is adjustable by adjusting a pull-up capability and/or a pull-down capability of the second inverter 12.

The pull-down capability of the second inverter 12 is increased when the pull-up capability of the second inverter 12 is increased. The pull-down capability of the second inverter 12 is decreased when the pull-up capability of the second inverter 12 is decreased.

Figure 5:
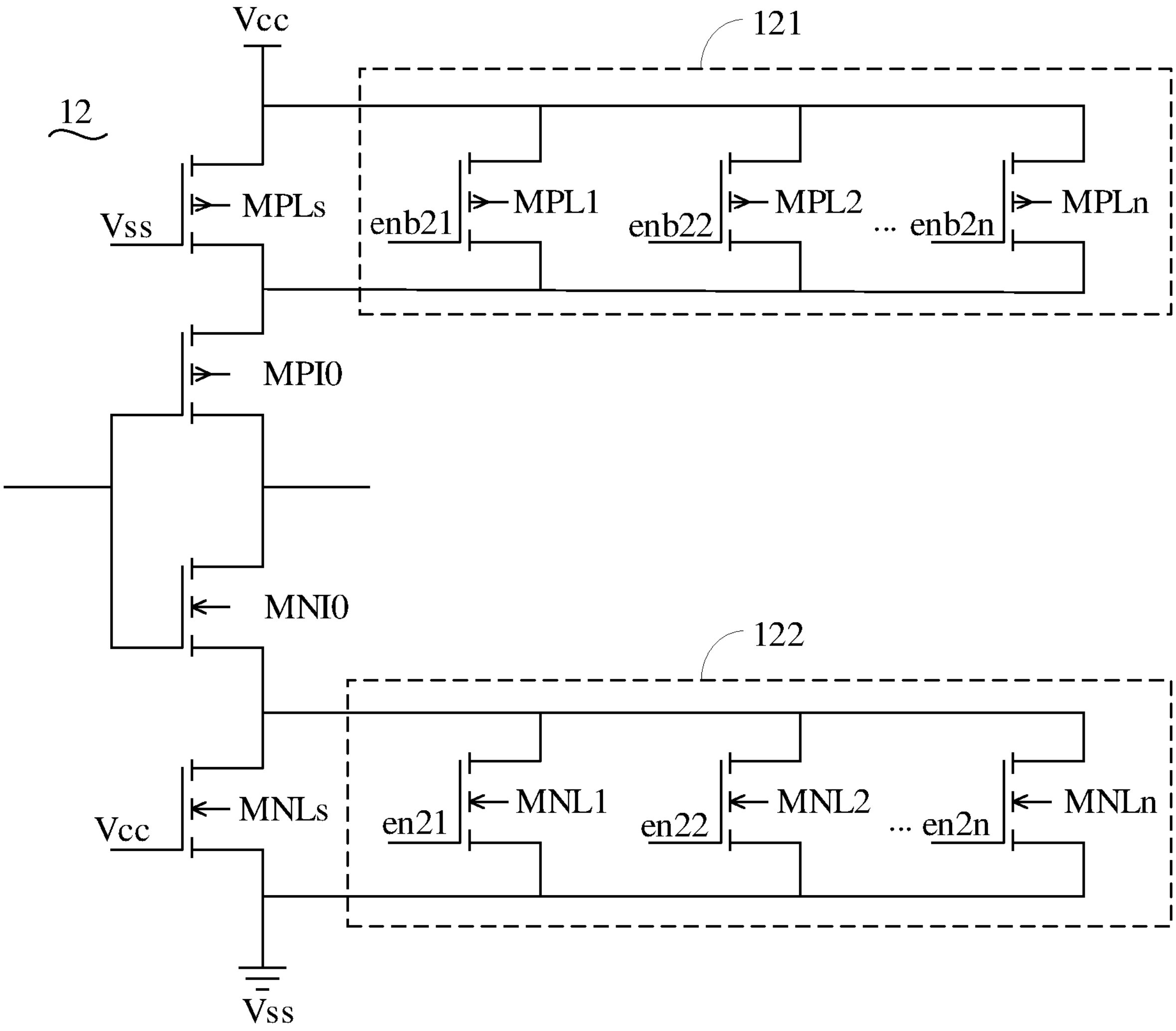
FIG. 5 is a schematic structural diagram of a second inverter in the oscillator shown in FIG. 2.

For example, referring to FIG. 5, the second inverter 12 includes: a fifth PMOS group 121, including L PMOSs (MPL1, MPL2, . . . , and MPLn), where a source of each of the L PMOSs is connected to a power terminal Vcc; a fifth NMOS group 122, including L NMOSs (MNL1, MNL2, . . . , and MNLn), where a source of each of the L NMOSs is connected to a ground terminal Vss; a fourth PMOS MPL0, having a source connected to a drain of each of the L PMOSs; and a fourth NMOS MNL0, having a source connected to a drain of each of the L NMOSs. A drain of the fourth PMOS MPL0 is connected to a drain of the fourth NMOS MNL0, as an output terminal of the second inverter 12. A gate of the fourth PMOS MPL0 is connected to a gate of the fourth NMOS MNL0, as an input terminal of the second inverter 12. A gate of each of the L PMOS transistors is controlled by a second reverse adjustment code group (enb21, enb22, . . . , and enb2*n*). A gate of each of the L NMOSs is controlled by a second positive adjustment code group (en21, en22, . . . , and en2*n*). The first transmission speed is adjustable by changing the second reverse adjustment code group and/or the second positive adjustment code group.

In some embodiments, a quantity of turned-on PMOS transistors in the fifth PMOS group 121 can be controlled by controlling parameters of the second reverse adjustment code group, thereby adjusting the pull-up capability of the second inverter 12; and/or a quantity of turned-on NMOS transistors in the fifth NMOS group 122 can be controlled by controlling parameters of the second positive adjustment code group, thereby adjusting the pull-down capability of the second inverter 12.

It should be noted that, the second reverse adjustment code group and the second positive adjustment code group have opposite potentials. When the second positive adjustment code en21 is at a high level, the second reverse adjustment code enb21 is at a low level. In this case, the first PMOS transistor MPL1 in the fifth PMOS group 121 is turned on, and the first NMOS transistor MNL1 in the fifth NMOS group 122 is turned on. Correspondingly, when the second positive adjustment code en21 is at a low level, the second reverse adjustment code enb21 is at a high level. In this case, the first PMOS is transistor MPL1 in the fifth PMOS group 121 is turned off, and the first NMOS transistor MNL1 in the fifth NMOS group 122 is turned off.

In other words, a larger quantity of turned-on PMOS transistors in the fifth PMOS group 121 indicates a larger quantity of turned-on NMOS transistors in the fifth NMOS group 122, a stronger pull-up capability and a stronger pull-down capability of the second inverter 12, and a higher frequency of the oscillation signal output by the second inverter 12. Correspondingly, a smaller quantity of turned-on PMOS transistors in the fifth PMOS group 121 indicates a smaller quantity of turned-on NMOS transistors in the fifth NMOS group 122, a weaker pull-up capability and a weaker pull-down capability of the second inverter 12, and a lower frequency of the oscillation signal output by the second inverter 12.

In addition, the second inverter 12 has an initial PMOS transistor MPLs for ensuring that the fourth PMOS MPL0 is in a working state, and an initial NMOS transistor MNLs for ensuring that the fourth NMOS MNL0 is in a working state.

Figure 6:
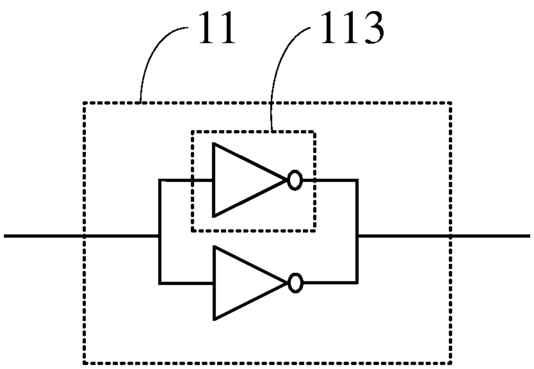
FIG. 6 is another schematic structural diagram of the first inverter in the oscillator shown in FIG. 2.

In some embodiments, referring to FIG. 6, the first inverter 11 includes a plurality of first sub-inverters 113, input terminals of the plurality of first sub-inverters 113 are all electrically connected, and output terminals of the plurality of first sub-inverters 113 are all electrically connected. This is beneficial to control a length of a connection wire between another component in an oscillator layout design and the first sub-inverter 113 to be close or equal, such that the oscillator layout has a better symmetrical balance, and each key node of the oscillator in the layout has a high degree of load matching, thereby making delays of all stages of inverters equal. In addition, this is also beneficial to make the length of the connection wire between the another component and the first sub-inverter 113 shorter, thereby reducing a parasitic resistance and a parasitic capacitance of the connection wire, and making the oscillator have favorable performance.

The quantity of the first sub-inverters 113 is an even number, which is beneficial to better symmetrical and balanced layout design.

Figure 7:
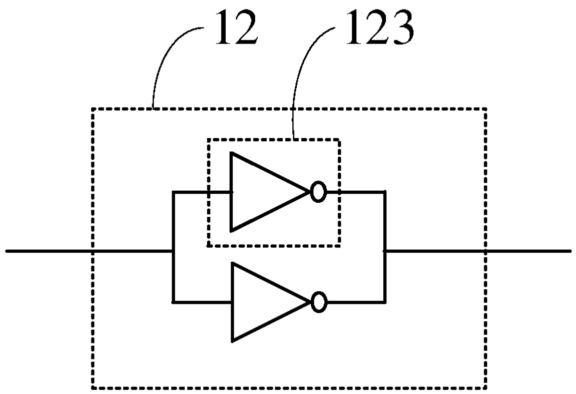
FIG. 7 is another schematic structural diagram of the second inverter in the oscillator shown in FIG. 2.

In some embodiments, referring to FIG. 7, the second inverter 12 includes a plurality of second sub-inverters 123, input terminals of the plurality of second sub-inverters 123 are all electrically connected, and output terminals of the plurality of second sub-inverters 123 are all electrically connected. This is beneficial to improve the symmetrical balance of the oscillator layout.

The quantity of the second sub-inverters 123 is equal to the quantity of the first sub-inverters 113. This is beneficial to improve the symmetrical balance of the oscillator layout, thereby obtaining an oscillator with better performance.

Referring to FIG. 4, FIG. 5, FIG. 6, and FIG. 7, the first inverter 11 and the second inverter 12 can be set to the same structure and size, and then transmission rates can be made different by using the first reverse adjustment code group and/or the second positive adjustment code group, and the second reverse adjustment code group and/or the second positive adjustment code group.

In some embodiments, compared with transmitting the oscillation signal only through the first ring topology, the setting of the second ring topology can increase a quantity of inversions of the oscillation signal per unit time at electrically connected nodes, thereby obtaining a high-speed oscillation signal.

Figure 8:
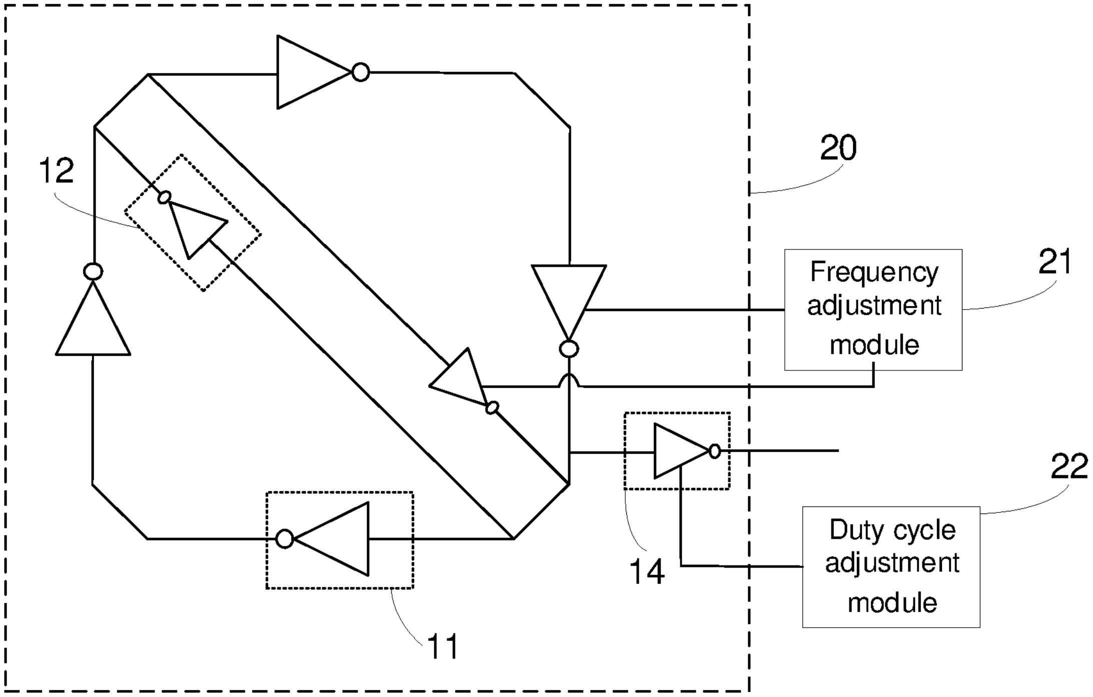
FIG. 8 is a schematic structural diagram of a clock generation circuit according to an embodiment of the present application.

Correspondingly, an embodiment of the present application further provides a clock generation circuit, including the oscillator provided in any one of the foregoing embodiments. FIG. 8 is a schematic structural diagram of a clock generation circuit according to an embodiment of the present application. The following describes the clock generation circuit in detail with reference to the accompanying drawings. For parts that are the same as or corresponding to those in the foregoing embodiments, reference may be made to the descriptions of the foregoing embodiments. Details are not described again below.

Referring to FIG. 8, the clock generation circuit includes: an oscillator 20; and a frequency adjustment module 21, connected to the oscillator 20, and configured to adjust a frequency of the oscillator 20.

The frequency adjustment module 21 adjusts a frequency of the oscillation signal of the oscillator 20 by adjusting the first transmission speed and/or the second transmission speed.

It can be understood that, the frequency adjustment module 21 can adjust the frequency of the oscillation signal of the oscillator 20 by adjusting the first transmission is speed and the second transmission speed. The frequency adjustment module 21 adjusts the first transmission speed of the first inverter 11 and the second transmission speed of the second inverter 12 to adjust the frequency of the oscillation signal of the oscillator 20, or the frequency adjustment module 21 may adjust one of the first transmission speed or the second transmission speed to adjust the frequency of the oscillation signal of the oscillator. Correspondingly, the frequency adjustment module 21 adjusts the first transmission speed of the first inverter 11 to adjust the frequency of the oscillation signal of the oscillator 20, or the frequency adjustment module 21 adjusts the second transmission speed of the second inverter 12 to adjust the frequency of the oscillation signal of the oscillator 20.

In some embodiments, for example, the frequency adjustment module 21 adjusts both the first transmission speed and the second transmission speed. The frequency adjustment module 21 is connected to the first inverter 11 and the second inverter 12. The frequency adjustment module 21 can adjust the first reverse adjustment code group to change the pull-up capability of the first inverter 11, and adjust the first positive adjustment code group to change the pull-down capability of the first inverter 11, thereby adjusting the first transmission speed of the first inverter 11, and adjusting the frequency of the oscillation signal of the oscillator 20. Correspondingly, the frequency adjustment module 21 can adjust the second reverse adjustment code group to change the pull-up capability of the second inverter 12, and adjust the second positive adjustment code group to change the pull-down capability of the second inverter 12, thereby adjusting the second transmission speed of the second inverter 12, and adjusting the frequency of the oscillation signal of the oscillator 20.

In other embodiments, the frequency adjustment module can be connected to the first inverter or the second inverter, and can change only the pull-up capability or the pull-down capability of the first inverter, or can change only the pull-up capability or the pull-down capability of the second inverter.

In some embodiments, the clock generation circuit further includes a duty cycle adjustment module 22, connected to the oscillator 20, and configured to adjust a duty cycle of the oscillation signal. The oscillator 20 includes the buffer inverter 14. The buffer inverter 14 is configured to receive the oscillation signal and output the clock signal. The duty cycle adjustment module 22 is connected to the buffer inverter 14. The duty cycle adjustment module 22 adjusts the pull-up capability and the pull-down capability of the buffer inverter 14 by adjusting the parameters of the duty cycle adjustment code group, such that the pull-up capability and the pull-down capability of the buffer inverter 14 change toward different regions, thereby adjusting the duty cycle of the clock signal.

In other embodiments, the duty cycle adjustment module can also be connected to the first inverter and/or the second inverter to adjust the duty cycle of the oscillation signal output by the first inverter and/or the second inverter, such that the oscillation signal output by the oscillator meets a preset duty cycle requirement.

In some embodiments, the clock generation circuit can reduce an impact of a clock load on a frequency and a duty cycle of a high-speed clock signal, thereby outputting a clock signal meeting a preset frequency requirement and a preset duty cycle requirement.

Those of ordinary skill in the art can understand that the above implementations are specific embodiments for implementing the present application. In practical applications, various changes may be made to the above embodiments in terms of form and details without departing from the spirit and scope of the present application. Any person skilled in the art may make changes and modifications to the embodiments without departing from the spirit and scope of the present disclosure. Therefore, the protection scope of the present disclosure should be subject to the scope defined by the claims.

The invention claimed is:

1. An oscillator, comprising:

a first ring topology, comprising a plurality of first inverters connected end to end, and configured to transmit an oscillation signal at a first transmission speed; and a second ring topology, comprising a plurality of second inverters connected end to end, and configured to transmit the oscillation signal at a second transmission speed, wherein the first ring topology is electrically connected to the second ring topology, the second transmission speed is less than the first transmission speed, the first transmission speed is adjustable, the first transmission speed is adjustable by adjusting at least one of a pull-up capability or a pull-down capability of the plurality of first inverters, the pull-down capability of the plurality of first inverters is increased when the pull-up capability of the plurality of first inverters is increased, and the pull-down capability of the plurality of first inverters is decreased when the pull-up capability of the plurality of first inverters is decreased.

2. The oscillator according to claim 1, wherein a quantity of first inverters in the plurality of first inverters is N, and N is an integer greater than or equal to 4.

3. The oscillator according to claim 2, wherein a quantity of second inverters in the plurality of second inverters is M, and M is an integer greater than or equal to 2.

4. The oscillator according to claim 3, wherein an input terminal of each first inverter is denoted as a first node, and the first ring topology has N first nodes; an input terminal of each second inverter is denoted as a second node, and the second ring topology has M second nodes; and at least two second nodes are electrically connected to a corresponding quantity of the first nodes.

5. The oscillator according to claim 1, further comprising:

a third ring topology, comprising a plurality of third inverters connected end to end, and configured to transmit the oscillation signal at a third transmission speed, wherein the first ring topology is electrically connected to the third ring topology, and the third transmission speed is less than or equal to the first transmission speed.

6. The oscillator according to claim 5, wherein a quantity of first inverters in the plurality of first inverters is U, and U is an integer greater than or equal to 4; a quantity of second inverters in the plurality of second inverters is V, and V is an integer greater than or equal to 2; and a quantity of third inverters in the plurality of third inverters is W, and W is an integer greater than or equal to 2.

7. The oscillator according to claim 6, wherein an input terminal of each first inverter is denoted as a first node, and the first ring topology has U first nodes; an input terminal of each second inverter is denoted as a second node, and the second ring topology has V second nodes; an input terminal of each third inverter is denoted as a third node, and the third ring topology has W third nodes; and at least two second nodes are electrically connected to a corresponding quantity of the first nodes, and at least two third nodes are electrically connected to a corresponding quantity of the first nodes.

8. The oscillator according to claim 7, wherein the third transmission speed is equal to the second transmission speed.

9. The oscillator according to claim 1, further comprising:

a buffer inverter, wherein an input terminal of the buffer inverter receives the oscillation signal, and an output terminal of the buffer inverter outputs a clock signal;

wherein a transmission speed of the buffer inverter is adjustable;

the transmission speed of the buffer inverter is adjustable by adjusting at least one of a pull-up capability or a pull-down capability of the buffer inverter;

the pull-down capability of the buffer inverter is decreased when the pull-up capability of the buffer inverter is increased; and the pull-down capability of the buffer inverter is increased when the pull-up capability of the buffer inverter is decreased.

10. The oscillator according to claim 9, wherein the buffer inverter comprises:

a first P-channel metal-oxide semiconductor (PMOS) group, comprising H PMOSs, wherein a source of each of the H PMOSs is connected to a power terminal;

a first N-channel metal-oxide semiconductor (NMOS) group, comprising H NMOSs, wherein a source of each of the H NMOSs is connected to a ground terminal;

a zeroth PMOS, having a source connected to a drain of each of the H PMOSs; and a zeroth NMOS, having a source connected to a drain of each of the H NMOSs, wherein a drain of the zeroth PMOS is connected to a drain of the zeroth NMOS, as the output terminal of the buffer inverter;

a gate of the zeroth PMOS is connected to a gate of the zeroth N MOS, as the input terminal of the buffer inverter; and a gate of each of the H PMOSs and a gate of each of the H NMOSs are both controlled by a duty cycle adjustment code group.

11. The oscillator according to claim 1, wherein each of the plurality of first inverters comprises:

a third P-channel metal-oxide semiconductor (PMOS) group, comprising I PMOSs, wherein a source of each of the I PMOSs is connected to a power terminal;

a third N-channel metal-oxide semiconductor (NMOS) group, comprising I NMOSs, wherein a source of each of the I NMOSs is connected to a ground terminal;

a second PMOS, having a source connected to a drain of each of the I PMOSs; and a second NMOS, having a source connected to a drain of each of the I NMOSs, wherein a drain of the second PMOS is connected to a drain of the second NMOS, as an output terminal of the first inverter;

a gate of the second PMOS is connected to a gate of the second N MOS, as an input terminal of the first inverter;

a gate of each of the I PMOSs is controlled by a first reverse adjustment code group, and a gate of each of the I NMOSs is control led by a first positive adjustment code group; and the first transmission speed is adjustable by changing at least one of the first reverse adjustment code group or the first positive adjustment code group.

12. The oscillator according to claim 1, wherein the second transmission speed is adjustable;

The second transmission speed is adjustable by adjusting at least one of a pull-up capability or a pull-down capability of the plurality of second inverters;

the pull-down capability of the plurality of second inverters is increased when the pull-up capability of the plurality of second inverters is increased; and the pull-down capability of the plurality of second inverters is decreased when the pull-up capability of the plurality of second inverters is decreased.

13. The oscillator according to claim 12, wherein each of the plurality of second inverters comprises:

a fifth P-channel metal-oxide semiconductor (PMOS) group, comprising L PMOSs, wherein a source of each of the L PMOSs is connected to a power terminal;

a fifth N-channel metal-oxide semiconductor (N MOS) group, comprising L NMOSs, wherein a source of each of the L NMOSs is connected to a ground terminal;

a fourth PMOS, having a source connected to a drain of each of the L PMOSs; and a fourth NMOS, having a source connected to a drain of each of the L NMOSs, wherein a drain of the fourth PMOS is connected to a drain of the fourth NMOS, as an output terminal of the second inverter;

a gate of the fourth PMOS is connected to a gate of the fourth NMOS, as an input terminal of the second inverter;

a gate of each of the L PMOSs is controlled by a second reverse adjustment code group, and a gate of each of the L NMOSs is controlled by a second positive adjustment code group; and the second transmission speed is adjustable by changing at least one of the second reverse adjustment code group or the second positive adjustment code group.

14. The oscillator according to claim 1, wherein each of the plurality of first inverters comprises a plurality of first sub-inverters, input terminals of the plurality of first sub-inverters are all electrically connected, and output terminals of the plurality of first sub-inverters are all electrically connected.

15. The oscillator according to claim 1, wherein each of the plurality of second inverters comprises a plurality of second sub-inverters, input terminals of the plurality of second sub-inverters are all electrically connected, and output terminals of the plurality of second sub-inverters are all electrically connected.

16. A clock generation circuit, comprising:

the oscillator according to claim 1; and a frequency adjustment module, connected to the oscillator, and configured to adjust a frequency of the oscillator.

17. The clock generation circuit according to claim 16, wherein the frequency adjustment module adjusts a frequency of the oscillation signal of the oscillator by adjusting at least one of the first transmission speed or the second transmission speed;

wherein the frequency adjustment module adjusts the at least one of the first transmission speed of the plurality of first inverters or the second transmission speed of the plurality of second inverters to adjust a frequency of the oscillation signal of the oscillator.

18. The clock generation circuit according to claim 16, further comprising: a duty cycle adjustment module, connected to the oscillator, and configured to adjust a duty cycle of the oscillation signal.

19. The oscillator according to claim 1, wherein the second transmission speed is greater than or equal to 0.5 times the first transmission speed.

* * * * *